(12) United States Patent
Nishiyama et al.

(10) Patent No.: US 7,767,582 B2
(45) Date of Patent: Aug. 3, 2010

(54) METHOD OF MANUFACTURING SEMICONDUCTOR DEVICE

(75) Inventors: Nobuyasu Nishiyama, Yokohama (JP);
Kazuhiro Tomioka, Yokohama (JP);
Tokuhisa Ohiwa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 985 days.

(21) Appl. No.: 11/525,179

(22) Filed: Sep. 22, 2006

(65) Prior Publication Data
US 2007/0082493 A1    Apr. 12, 2007

(30) Foreign Application Priority Data
Oct. 11, 2005    (JP) .............................. 2005-296567

(51) Int. Cl.
*H01L 21/311* (2006.01)
(52) U.S. Cl. ............... 438/694; 438/700; 257/E21.009; 257/E21.249; 257/E21.311; 257/E21.314; 257/E29.255
(58) Field of Classification Search ........................ None
See application file for complete search history.

(56) References Cited

U.S. PATENT DOCUMENTS

| | | | | |
|---|---|---|---|---|
| 5,661,592 A | * | 8/1997 | Bornstein et al. ............ | 359/291 |
| 5,994,750 A | * | 11/1999 | Yagi ............................ | 257/415 |
| 6,020,215 A | * | 2/2000 | Yagi et al. ..................... | 438/52 |
| 6,097,051 A | | 8/2000 | Torii et al. | |
| 6,268,232 B1 | * | 7/2001 | Skapa et al. .................. | 438/51 |
| 6,483,283 B2 | * | 11/2002 | Uayanagi et al. ........... | 324/71.5 |

FOREIGN PATENT DOCUMENTS

| | | |
|---|---|---|
| JP | 09-162311 | 6/1997 |
| JP | 11-126779 | 5/1999 |
| JP | 2000-196106 | 7/2000 |
| JP | 2001-15479 | 1/2001 |
| JP | 2001-313282 | 11/2001 |

OTHER PUBLICATIONS

Notification of Reasons for Rejection, mailed Apr. 6, 2010, in corresponding Japanese Patent Application No. 2005-296567, and English-language translation thereof. Yes.

* cited by examiner

*Primary Examiner*—Allan Olsen
(74) *Attorney, Agent, or Firm*—Finnegan, Henderson, Farabow, Garrett & Dunner, L.L.P.

(57) ABSTRACT

A method of manufacturing a semiconductor device, includes forming a sacrifice film on an etching target film, forming an etching mask on the sacrifice film, etching the etching target film using the etching mask as a mask, removing the sacrifice film to allow the etching mask to adhere to the etching target film, and removing the etching mask.

19 Claims, 6 Drawing Sheets

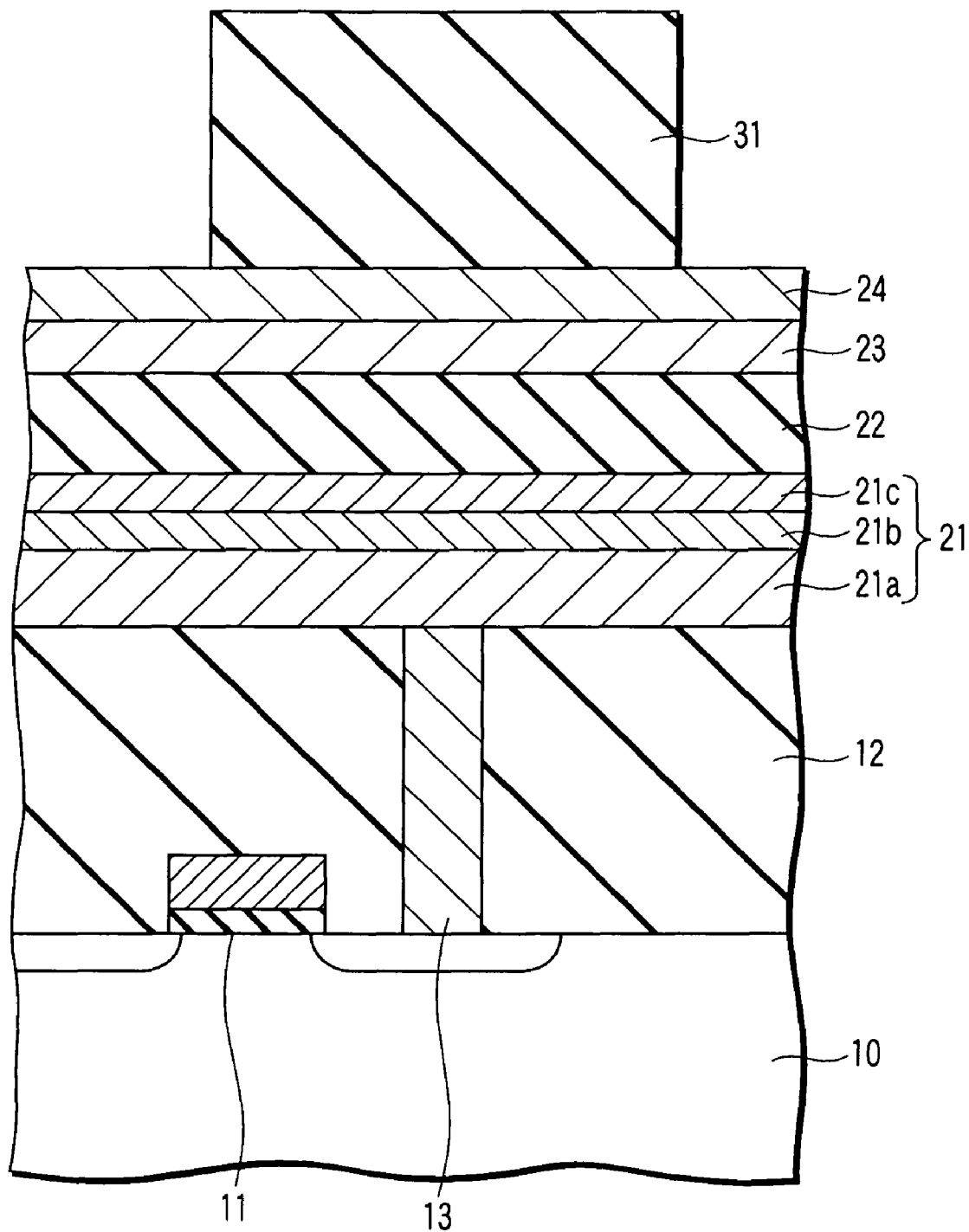
F I G. 1

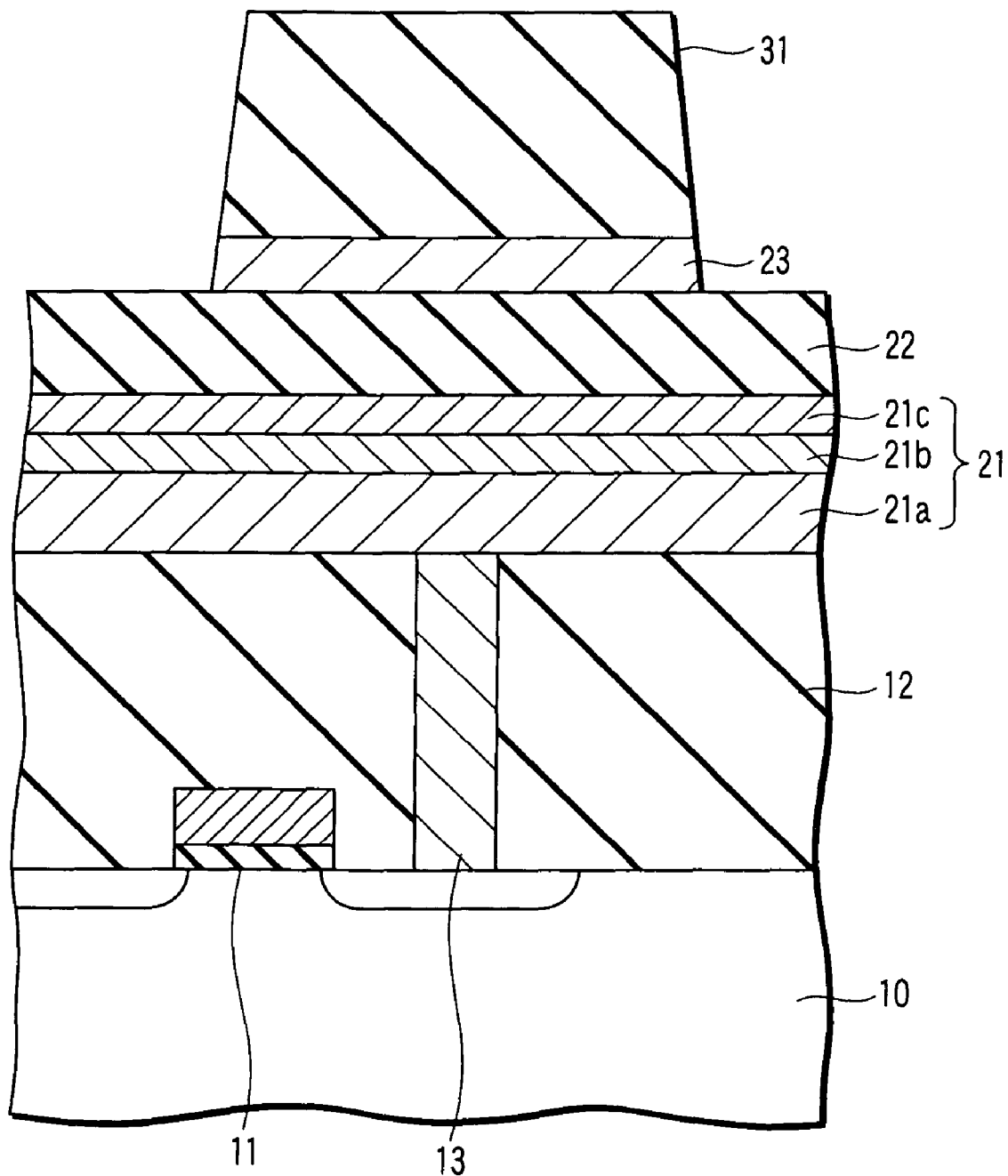
F I G. 2

US 7,767,582 B2

METHOD OF MANUFACTURING SEMICONDUCTOR DEVICE

CROSS-REFERENCE TO RELATED APPLICATIONS

This application is based upon and claims the benefit of priority from prior Japanese Patent Application No. 2005-296567, field Oct. 11, 2005, the entire contents of which are incorporated herein by reference.

BACKGROUND OF THE INVENTION

1. Field of the Invention

The present invention relates to a method of manufacturing a semiconductor device.

2. Description of the Related Art

In recent years, efforts have been made to develop a ferroelectric memory that uses a ferroelectric film as a dielectric film for a capacitor. In a ferroelectric memory, noble metal such as platinum is used for capacitor electrodes in order to suppress reaction of the ferroelectric film during crystallization annealing (see, for example, Jpn. Pat. Appln. KOKAI Publication No. 9-162311).

However, a product (noble metal compound) obtained by etching noble metal such as platinum exerts a low saturated vapor pressure. This makes it difficult to appropriately achieve anisotropic etching. Accordingly, appropriate anisotropic etching requires substrate temperature to be increased to about 300 to 400° C. It is thus difficult to use a photoresist as an etching mask. Consequently, anisotropic etching is generally carried out using a hard mask such as a silicon oxide film.

A hard mask is formed by a film forming method such as CVD or sputtering. A film formed by such a film forming method generally adheres well. Consequently, the hard mask cannot be easily removed by the above method.

On the other hand, the reduced size of semiconductor devices has made it difficult to precisely process gate electrodes of MIS transistors by anisotropic etching. To form gate electrodes by anisotropic etching, it is necessary to maximize the etching selective ratio of gate electrode films to gate insulating films.

However, a higher etching selective ratio enlarges the lower part of the gate electrode, which thus has an inappropriate shape. An attempt to reduce the etching selective ratio to improve the gate electrode shape may disadvantageously result in etching the gate insulating film, exposing a semiconductor substrate.

As described above, if an adhesive film such as a hard mask is used as an etching mask to etch an etching target film, removing the etching mask is disadvantageously difficult.

Further, if the etching target film such as the gate electrode film is etched, it is disadvantageously difficult to obtain an appropriate etching processing shape without affecting an underlying film such as the gate insulating film.

BRIEF SUMMARY OF THE INVENTION

According to a first aspect of the present invention, there is provided a method of manufacturing a semiconductor device, comprising: forming a sacrifice film on an etching target film; forming an etching mask on the sacrifice film; etching the etching target film using the etching mask as a mask; removing the sacrifice film to allow the etching mask to adhere to the etching target film; and removing the etching mask.

According to a second aspect of the present invention, there is provided a method of manufacturing a semiconductor device, comprising: forming a sacrifice film on an underlying film; forming an etching target film on the sacrifice film; forming an etching mask on the etching target film; etching the etching target film using the etching mask as a mask; and removing the sacrifice film to allow the etched etching target film to adhere to the underlying film.

BRIEF DESCRIPTION OF THE SEVERAL VIEWS OF THE DRAWING

FIGS. 1 to 4 are sectional views schematically showing a process for manufacturing a semiconductor device according to a first embodiment of the present invention;

DETAILED DESCRIPTION OF THE INVENTION

Figure 3:
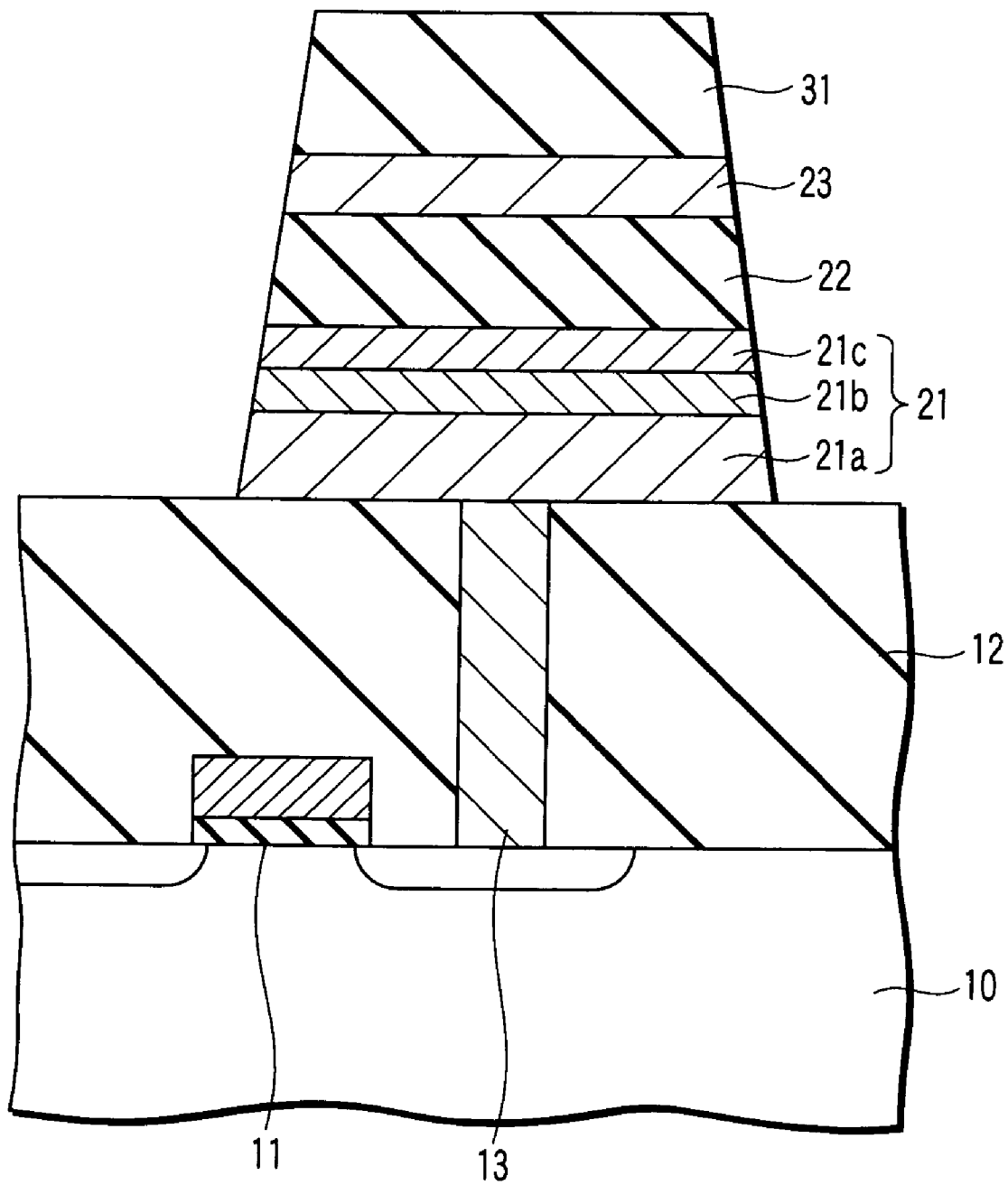

Embodiments of the present invention will be described below with reference to the drawings.

Embodiment 1

FIGS. 1 to 4 are sectional views schematically showing a process for manufacturing a semiconductor device (ferroelectric memory) according to a first embodiment of the present invention.

First, as shown in FIG. 1, an isolation area (not shown) and a MIS transistor 11 are formed in a surface area of a semiconductor substrate (for example, a silicon substrate). An insulating area 12 containing an interlayer insulating film is subsequently formed on the semiconductor substrate 10. A plug 13 is further formed in the insulating area 12 to electrically connect the MIS transistor 11 to a capacitor described below.

A bottom electrode film 21 of the capacitor is formed on the insulating area 12 by a sputtering process. The bottom electrode film 21 includes an iridium (Ir) film 21a of thickness 120 nm, an iridium oxide ($IrO_2$) film 21b of thickness 50 nm, and a platinum (Pt) film 21c of thickness 50 nm. A $Pb(Zr_xTi_{1-x})O_3$ film (PZT film) 22 of thickness 140 nm is subsequently formed on the platinum film 21c by the sputtering process as a dielectric film (ferroelectric film) of the capacitor. A platinum (Pt) film 23 of thickness 70 nm is further formed on the PZT film 22 by the sputtering process as a top electrode film of the capacitor. The iridium film 21a, iridium oxide film 21b, platinum film 21c, PZT film 22, and platinum film 23 are etching target films to be etched in a step described below.

A titanium (Ti) film 24 of thickness 50 nm is then formed on the platinum film 23 by the sputtering process as a sacrifice film. A silicon oxide film ($SiO_2$ film) 31 of thickness 1 μm is subsequently formed by a plasma CVD (Chemical Vapor Deposition) process as an etching mask. The silicon oxide film 31 is used as a hard mask for forming a capacitor pattern. A photoresist pattern (not shown) is formed on the silicon oxide film 31 by photolithography. This photoresist pattern is further used as a mask to pattern the silicon oxide film 31 using a magnetron RIE (Reactive Ion Etching) apparatus. An etching gas used is a mixture of $C_4F_8$ and Ar. After the silicon oxide film 31 is patterned, the photoresist pattern is removed by ashing using oxygen gas plasma. An etching mask formed of the silicon oxide film 31 is thus obtained.

As shown in FIG. 2, the silicon oxide film 31 is then used as a mask to dry etch the titanium film 24 and platinum film 23 using an inductively-coupled plasma RIE apparatus. An etching gas used is a mixture of $Cl_2$ and Ar. The flow rates of $Cl_2$ and Ar are 160 and 40 sccm, respectively. The pressure in an RIE chamber is set at 2 Pa, and RF power supplied to an inductively-coupled coil is set at 1 kW. RF power supplied to a wafer susceptor is set at 200 W. The temperature of the wafer susceptor is set at 350° C. Dry etching is carried out with the semiconductor substrate 10 heated.

It is difficult to evaporate a platinum compound such as platinum chloride which is generated during the dry etching process, owing to its low saturated vapor pressure. Thus, if for example, the dry etching process is executed at room temperature, an adhering platinum compound may prevent the appropriate anisotropic etching of the platinum film 23. The present embodiment executes dry etching at a temperature of about 300 to 400° C. This enables the platinum film 23 to be appropriately anisotropically etched. In other words, anisotropic etching can be appropriately achieved even if the etching target film contains noble metal film such as the platinum film 23.

On the other hand, it is easy to evaporate a titanium compound such as titanium chloride which is generated during the dry etching process, owing to its high saturated vapor pressure. Specifically, the titanium compound generated during the dry etching process has a higher saturated vapor pressure than the platinum compound generated during the dry etching process. The higher saturated vapor pressure of the titanium compound causes a neutral active species in plasma to isotropically etch the titanium film 24. This allows the whole titanium film 24 to be etched away during the dry etching process.

The dry etching process thus eliminates the titanium film 24 interposed between the silicon oxide film 31 and the platinum film 23. Consequently, the silicon oxide film 31 adheres to the surface of the platinum film 23. Specifically, the silicon oxide film 31 may fall onto the platinum film 23 owing to gravity and adhere to the platinum film 23, or the electrostatic force between the silicon oxide film 31 and the platinum film 23 may cause the silicon oxide film 31 to adhere to the platinum film 23. Alternatively, these phenomena may be combined together to cause the silicon oxide film 31 to adhere to the platinum film 23. After adhering to the platinum film 23, the silicon oxide film 31 remains adhered to the platinum film 23 mainly by electrostatic force.

In the above dry etching process, the anisotropic etching of the platinum film 23 is executed in parallel with the removal of the titanium film 24. This results in such a structure as shown in FIG. 2.

Then, as shown in FIG. 3, the silicon oxide film 31 adhering to the surface of the platinum film 23 is used as an etching mask to anisotropically etch a PZT film 22 and a platinum film 21c using the above inductively-coupled plasma RIE apparatus. An etching gas used is a mixture of $Cl_2$, Ar, and $N_2$. The flow rates of $Cl_2$, Ar, and $N_2$ are 160, 40, and 10 sccm, respectively. The other basic etching conditions are the same as those for the above platinum film 23 and titanium film 24.

The silicon oxide film 31 is then used as an etching mask to anisotropically etch the iridium oxide film 21b and iridium film 21a using the above inductively-coupled plasma RIE apparatus. An etching gas used is a mixture of $Cl_2$, Ar, $N_2$, and $O_2$. The flow rates of $Cl_2$, Ar, $N_2$, and $O_2$ are 160, 20, 30, and 20 sccm, respectively. The pressure in the chamber is 4 Pa. The other basic etching conditions are the same as those for the above platinum film 23 and titanium film 24.

Figure 4:
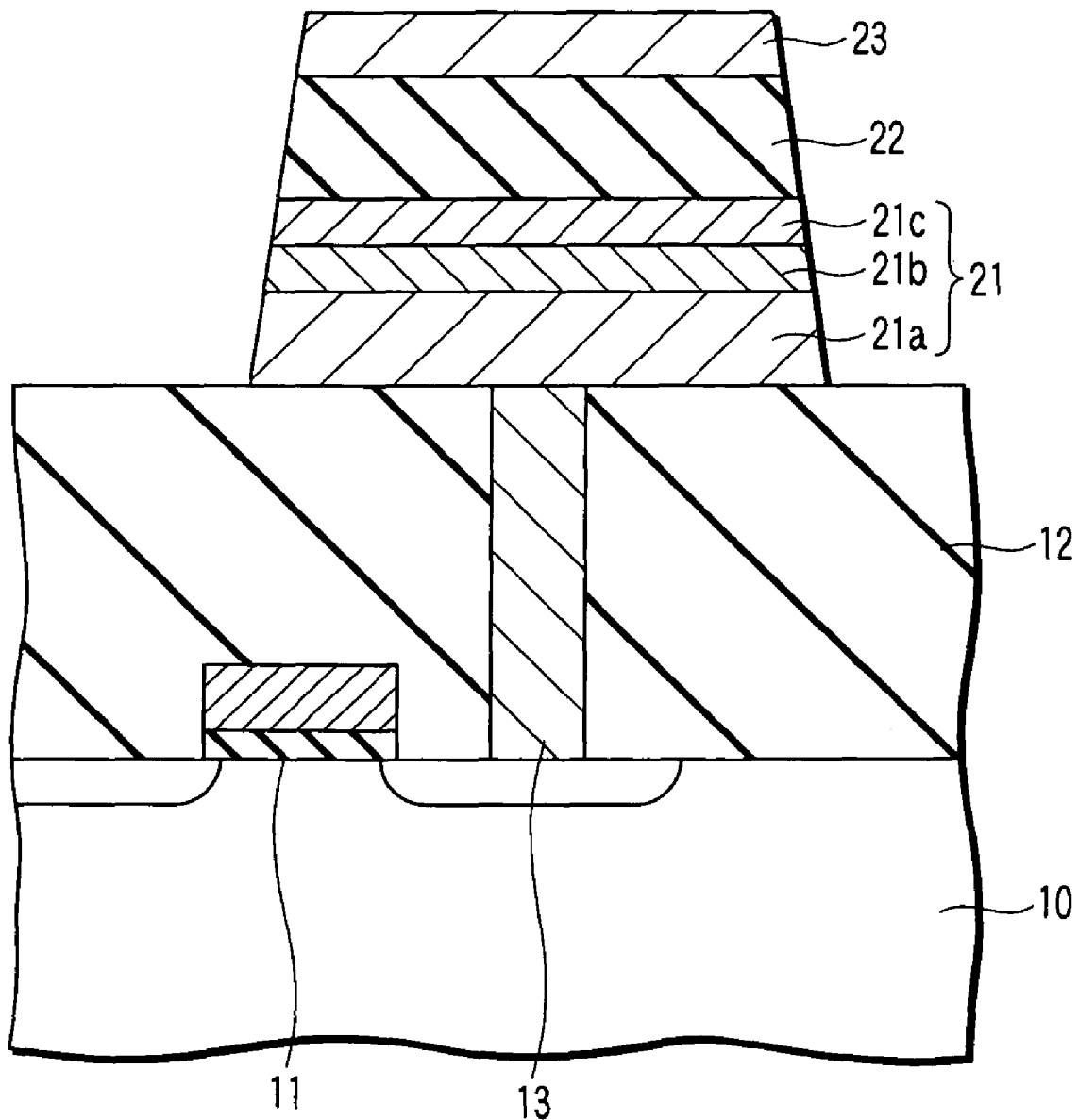

Then, as shown in FIG. 4, the silicon oxide film 31, used as the etching mask, is removed. Since the silicon oxide film 31 adheres to the platinum film 23 mainly by electrostatic force, the adhesion is weak. Accordingly, instead of the chemical method such as etching, a non-chemical method can be used to easily remove the silicon oxide film 31. Specifically, a dynamical method described below can be used to remove the silicon oxide film 31.

A first method sticks an adhesive tape to the surface of the silicon oxide film 31 and strips the silicon oxide film 31 off from the platinum film 23 together with the adhesive tape. A second method washes the silicon oxide film 31 away with a liquid such as water. In this case, a surface active agent may be added to the liquid such as water. The surface active agent allows the silicon oxide film 31 to be stripped off from the platinum film 23. A third method uses electrostatic force to strip the silicon oxide film 31 off from the platinum film 23. Any of these methods enables the silicon oxide film 31 to be easily stripped off from the platinum film 23 because the silicon oxide film 31 adheres weakly to the platinum film 23.

The above process results in a capacitor structure including the bottom electrode 21 formed of the iridium film 21a, iridium oxide film 21b and platinum film 21c, the dielectric film (ferroelectric film) formed of the PZT film 22, and the top electrode formed of the platinum film 23.

As described above, the present embodiment removes the titanium film (sacrifice film) 24 interposed between the silicon oxide film (etching mask) 31 and platinum film (etching target film) 23 to allow the silicon oxide film 31 to adhere to the platinum film 23. The silicon oxide film 31 thus adheres weakly to the platinum film 23. The silicon oxide film 31 can thus be easily removed without using any chemical method such as etching. This enables the manufacturing process to be facilitated and simplified.

The present embodiment executes the anisotropic etching of the platinum film 23 and the removal of the titanium film 24 during the same step. This enables the omission of a dedicated step of removing the titanium film 24. The manufacturing process can also be simplified in this regard.

Figure 5:
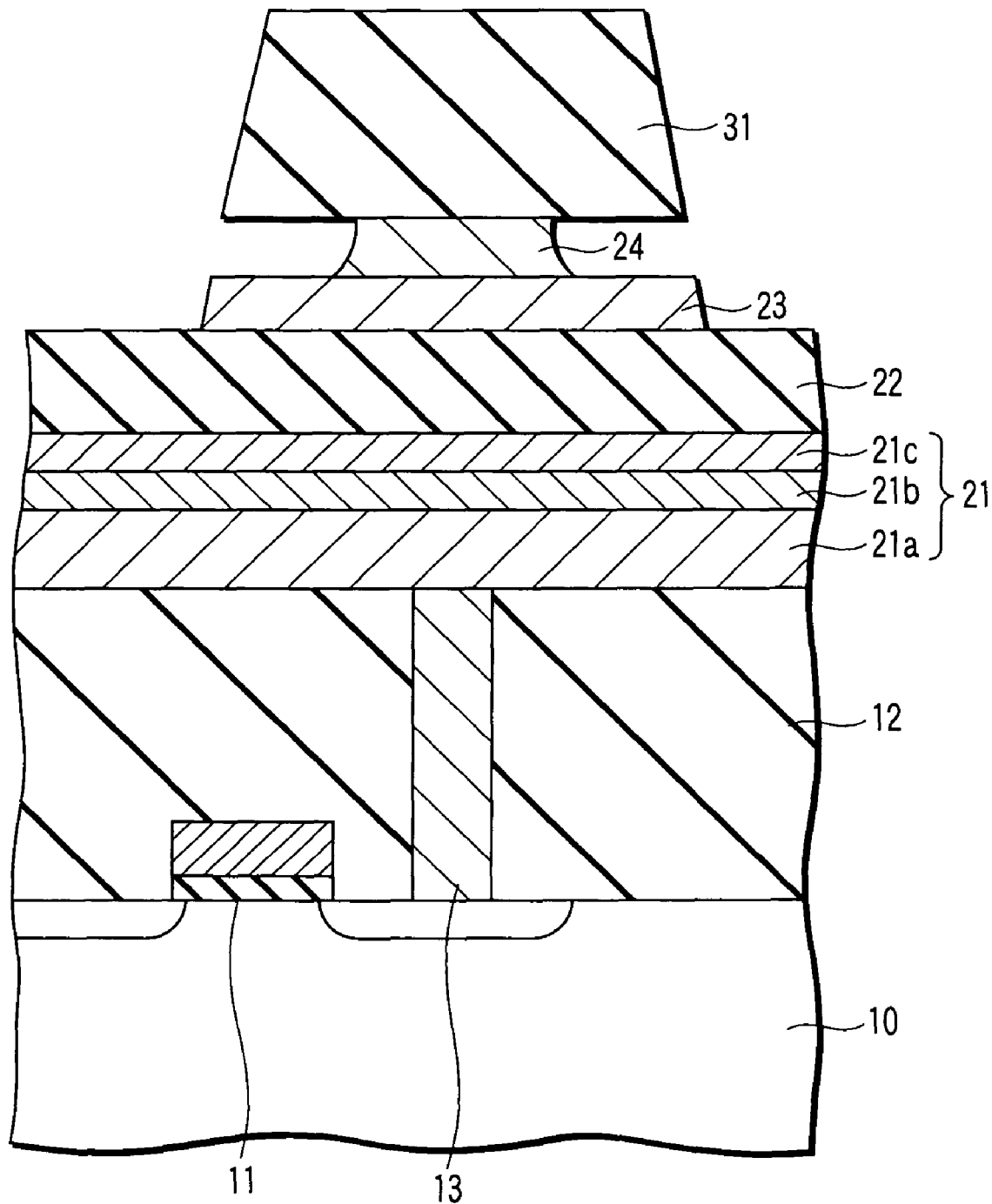
FIG. 5 is a sectional view schematically showing a part of a process for manufacturing a semiconductor device according to a variation of the first embodiment of the present invention.

The above embodiment removes the whole titanium film 24 during the step of anisotropically etching the platinum film 23. However, the titanium film 24 may partly remain after the platinum film 23 has been etched, as shown in FIG. 5. In this case, the titanium film 24 has only to be completely removed after any of the PZT film 22, platinum film 21c, iridium oxide film 21b, and iridium film 21a has been etched. Also in this case, the whole titanium film (sacrifice film) 24 can be removed during the step of etching the etching target film (iridium film 21a, iridium oxide film 21b, platinum film 21c, PZT film 22, and platinum film 23). This enables the omission of a dedicated step of removing the titanium film 24. The manufacturing process can also be simplified in this regard.

It is also possible to execute the etching of the etching target film and the removal of the sacrifice film to be executed during different steps. For example, the titanium film 24 may be removed after the etching mask of the silicon oxide film 31 has been formed and before platinum film 23 is etched. Alternatively, the titanium film 24 may be removed after the iridium film 21a has been etched. Alternatively, the titanium film 24 may be removed during any of the steps from the etching of the platinum film 23 to the etching of the iridium film 21a which is different from the steps of etching the etching target film.

The description of the above embodiment relates to the ferroelectric capacitor. A method similar to that described above can be used to, for example, form a wiring pattern using a hard mask as an etching mask.

The above embodiment uses the titanium film as a sacrifice film. However, the material of the sacrifice film may be titanium (Ti), tungsten (W), tantalum (Ta), or their oxides or nitrides.

The etching mask may be composed of, instead of the silicon oxide described above, silicon (for example, polysilicon) or silicon nitride.

The etching target film may be composed of, instead of the materials in the above embodiment, copper (Cu), palladium (Pd), silver (Ag), or gold (Au). Further, materials for the etching target film may include beryllium (Be), aluminum (Al), calcium (Ca), strontium (Sr), yttrium (Y), zirconium (Zr), hafnium (Hf), or their oxides or nitrides.

Embodiment 2

Figure 6:
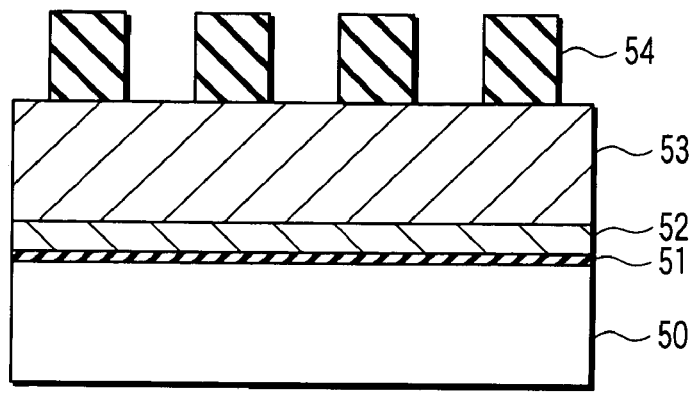
FIGS. 6 to 8 are sectional views schematically showing a process for manufacturing a semiconductor device according to a second embodiment of the present invention.
Figure 7:
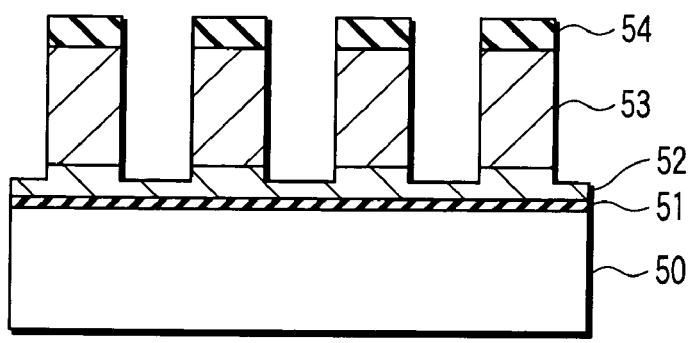
Figure 8:
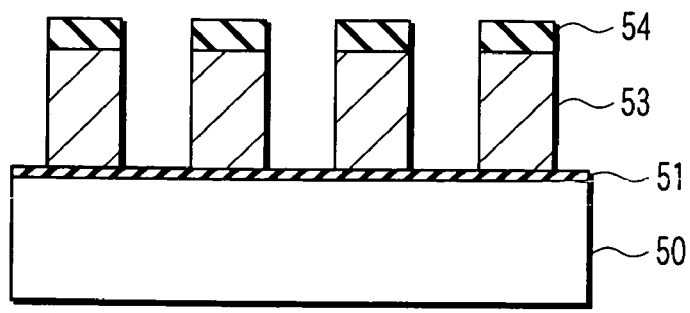

FIGS. 6 to 8 are sectional views schematically showing a process for manufacturing a semiconductor device (MIS transistor) according to a second embodiment of the present invention.

First, as shown in FIG. 6, an isolation area (not shown) is formed in a surface area of a semiconductor substrate (for example, a silicon substrate) 50. A gate insulating film 51 is formed on the semiconductor substrate 50 as an underlying film. The gate insulating film 51 may be a silicon oxide film ($SiO_2$ film) or a silicon oxinitride film (SiON film). Alternatively, the gate insulating film 51 may be what is called a high-k film such as an alumina film ($Al_2O_3$ film), an HfSiO film, or an HfAlO film. For example, a polysilicon film or amorphous silicon film is formed on the gate insulating film 51 as a sacrifice film 52. The thickness of the sacrifice film 52 is, for example, about half that of a gate electrode film 53 described below. A gate electrode film 53 is subsequently formed on the sacrifice film 52 as an etching target film. For example, a metal film such as tungsten (W) is used as the gate electrode film 53.

Then, a hard mask film 54 is formed on the gate electrode film 53 as an etching mask film. The hard mask film 54 may be, for example, a silicon oxide film or a silicon nitride film. Subsequently, a photoresist pattern (not shown) is formed on the hard mask film 54 by photolithography. The photoresist pattern is subsequently used as a mask to pattern the hard mask film 54 by dry etching. An etching gas used is fluorocarbon-based (CF-based) gas. The photoresist pattern is then removed. This results in an etching mask formed of the hard mask film 54 as shown in FIG. 6.

Then, as shown in FIG. 7, the hard mask film 54 is used as a mask to anisotropically etch the gate electrode film 53 by RIE to form a gate electrode. An etching gas used is a mixture of a gas such as $NF_3$, $Cl_2$, or $BCl_3$ and a gas such as $CH_4$, CO, $O_2$, or $N_2$. In this anisotropic etching, the sacrifice film 52 may be etched to some extent unless the surface of the gate insulating film 51 is exposed. This enables the gate electrode film 53 to be anisotropically etched under etching conditions that focus on processed shape rather than an etching selective ratio. This in turn prevents the gate electrode from being shaped to have an enlarged lower portion as in the case of the prior art, while allowing it to be appropriately shaped so as to have vertical sides. Further, the gate insulating film 51 protected by the sacrifice film 52 makes it possible to prevent the gate insulating film 51 from being damaged by anisotropic etching.

Then, as shown in FIG. 8, the sacrifice film 52 is selectively etched away by chemical dry etching (CDE). $SF_6$ or $NF_3$ is used as an etching gas. The dry etching eliminates the sacrifice film 52 interposed between the gate insulating film 51 and the gate electrode film 53. Consequently, the gate electrode film 53 adheres to the surface of the gate insulating film 51. Specifically, the gate electrode film 53 may fall onto the gate insulating film 51 owing to gravity and adhere to the gate insulating film 51, or the electrostatic force between the gate electrode film 53 and the gate insulating film 51 may cause the gate electrode film 53 to adhere to the gate insulating film 51. Alternatively, these phenomena may be combined together to cause the gate electrode film 53 to adhere to the gate insulating film 51.

After the gate electrode film 53 adheres to the gate insulating film 51, a thermal treatment is executed. The thermal treatment increases adhesion of the gate electrode film 53 to the gate insulating film 51. This enables the gate electrode film 53 to remain firmly fixed to the gate insulating film 51 without stripping the gate electrode film 53 off from the gate insulating film 51.

As described above, the present embodiment anisotropically etches the gate electrode film 53 with the sacrifice film 52 interposed between the gate insulating film 51 and the gate electrode film 53. This provides an appropriate gate electrode shape without damaging the gate insulating film 51. Further, removal of the sacrifice film 52 enables the gate electrode film 53 to adhere to the gate insulating film 51. A MIS structure can thus be reliably formed.

The above embodiment uses the metal film as the gate electrode film 53. However, a polysilicon film may be used as the gate electrode film 53. In this case, a silicon oxide film used as the gate insulating film 51 allows, for example, a silicon nitride film to be used as the sacrifice film 52. Alternatively, a high-k film such as alumina used as the gate insulating film 51 enables a silicon oxide film or a silicon nitride film to be used as the sacrifice film 52.

The above embodiment uses dry etching to remove the sacrifice film 52. However, wet etching with vapors can also be used.

The above embodiment uses the silicon oxide film or silicon nitride film as an etching mask. However, a photoresist film may also be used as an etching mask.

The MIS transistor in the above embodiment uses the gate insulating film as an underlying film and the gate electrode film as an etching target film. However, a method similar to that described above may be used if an appropriate etching processed shape needs to be achieved without affecting the underlying film.

The present invention is not limited to the first or second embodiment. For example, in a structure in which sacrifice films are provided over and under an etching target film, the sacrifice films may be removed after etching the hard mask film or etching target film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:

forming a sacrifice film on an etching target film;

forming an etching mask on the sacrifice film;

etching the etching target film using the etching mask as a mask;

removing the sacrifice film to allow the etching mask to adhere to the etching target film; and
removing the etching mask.

2. The method according to claim 1, wherein the sacrifice film is etched away in etching the etching target film.

3. The method according to claim 2, wherein a compound generated by etching the sacrifice film has a higher saturated vapor pressure than a compound generated by etching the etching target film.

4. The method according to claim 1, wherein etching the etching target film and removing the sacrifice film are executed during different steps.

5. The method according to claim 1, wherein the etching target film is anisotropically etched in etching the etching target film.

6. The method according to claim 1, wherein the etching mask is removed by a non-chemical method.

7. The method according to claim 1, wherein the etching mask is removed by a dynamical method.

8. The method according to claim 1, wherein the etching mask adheres to the etching target film by at least one of gravity on the etching mask and electrostatic force between the etching mask and the etching target film.

9. The method according to claim 1, wherein electrostatic force between the etching mask and the etching target film keeps the etching mask adhered to the etching target film.

10. The method according to claim 1, wherein the etching mask is formed of a hard mask.

11. The method according to claim 1, wherein the etching target film includes a top electrode film of a capacitor.

12. The method according to claim 1, wherein the etching target film includes a noble metal film.

13. The method according to claim 12, wherein a material for the sacrifice film is selected from titanium (Ti), tungsten (W), tantalum (Ta), and their oxides and nitrides.

14. A method of manufacturing a semiconductor device, comprising:
    forming a sacrifice film on an underlying film;
    forming an etching target film on the sacrifice film;
    forming an etching mask on the etching target film;
    etching the etching target film using the etching mask as a mask;
    removing the sacrifice film to allow the etched etching target film to adhere to the underlying film; and
    performing a thermal treatment to increase adhesion of the etching target film to the underlying film.

15. The method according to claim 14, wherein the underlying film is protected by the sacrifice film in etching the etching target film.

16. The method according to claim 14, wherein the etching target film is anisotropically etched in etching the etching target film.

17. The method according to claim 14, wherein the etching target film adheres to the underlying film by at least one of gravity on the etching target film and electrostatic force between the etching target film and the underlying film.

18. The method according to claim 14, wherein the underlying film is a gate insulating film of a MIS transistor, and
    the etching target film is a gate electrode film of the MIS transistor.

19. The method according to claim 18, wherein the gate electrode film is formed of a metal film, and
    the sacrifice film is formed of a polysilicon film or an amorphous silicon film.

* * * * *